(12) United States Patent
Liu et al.

(10) Patent No.: US 9,431,126 B2
(45) Date of Patent: Aug. 30, 2016

(54) NON-VOLATILE MEMORY PROGRAM ALGORITHM DEVICE AND METHOD

(71) Applicant: Silicon Storage Technology, Inc., San Jose, CA (US)

(72) Inventors: Xian Liu, Sunnyvale, CA (US); James Cheng, New Taipei (TW); Dmitry Bavinov, Moscow (RU); Alexander Kotov, San Jose, CA (US); Jong-Won Yoo, Cupertino, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/214,097

(22) Filed: Mar. 14, 2014

(65) Prior Publication Data

US 2014/0269058 A1    Sep. 18, 2014

Related U.S. Application Data

(60) Provisional application No. 61/785,485, filed on Mar. 14, 2013.

(51) Int. Cl.
*G11C 16/04* (2006.01)
*G11C 16/34* (2006.01)
(Continued)

(52) U.S. Cl.
CPC ....... *G11C 16/3486* (2013.01); *G11C 11/5628* (2013.01); *G11C 11/5642* (2013.01); *G11C 16/0441* (2013.01); *G11C 16/12* (2013.01); *G11C 16/3459* (2013.01); *G11C 16/10* (2013.01)

(58) Field of Classification Search
CPC .......... G11C 11/5628; G11C 11/5642; G11C 16/10; G11C 13/0069; G11C 11/5621; G11C 16/12; G11C 2211/5621; G11C 16/3454; G11C 16/3459

USPC ............. 365/185.03, 185.19, 185.18, 185.24
See application file for complete search history.

(56) References Cited

U.S. PATENT DOCUMENTS 6,490,203 B1 * 12/2002 Tang ..................... G11C 16/28
365/185.2
7,054,199 B2    5/2006 Lee et al.
(Continued)

FOREIGN PATENT DOCUMENTS

CN          1661727      8/2005
JP         2002319293    10/2002
(Continued)

OTHER PUBLICATIONS

PCT Search Report and Written Opinion mailed on Sep. 25, 2014 corresponding to the related PCT Patent Application No. US14/029414.
(Continued)

*Primary Examiner* — David Lam
(74) *Attorney, Agent, or Firm* — DLA Piper LLP (US)

(57) ABSTRACT

A non-volatile memory device and method for programming cells using repeated pulses of program voltages, with interleaved read operations to determine the level of read current, until the desired programming state is achieved. Each successive program pulse has one or more program voltages increased by a step value relative to the previous pulse. For a single level cell type, each cell is individually removed from the programming pulses after reaching a first read current threshold, and the step value is increased for one or more kicker pulses thereafter. For a multi-level cell type, the step value drops after one of the cells reaches a first read current threshold, some cells are individually removed from the programming pulses after reaching a second read current threshold while others are individually removed from the programming pulses after reaching a third read current threshold.

38 Claims, 6 Drawing Sheets

(51) Int. Cl.
  *G11C 16/12* (2006.01)
  *G11C 11/56* (2006.01)
  *G11C 16/10* (2006.01)

(56) References Cited

U.S. PATENT DOCUMENTS

| | | | |
|---|---|---|---|
| 7,927,994 | B1 | 4/2011 | Liu et al. |
| 8,223,556 | B2 * | 7/2012 | Dutta ................. G11C 11/5628 365/185.03 |
| 8,369,143 | B2 * | 2/2013 | Franca-Neto et al. ... 365/185.03 |
| 2002/0191444 | A1 | 12/2002 | Gregori et al. |
| 2005/0190603 | A1 | 9/2005 | Lee et al. |
| 2008/0175064 | A1 | 7/2008 | Wang |
| 2011/0161571 | A1 | 6/2011 | Kim et al. |

FOREIGN PATENT DOCUMENTS

| | | |
|---|---|---|
| JP | 2005243230 | 9/2005 |
| JP | 2008191630 | 8/2008 |
| JP | 2013512534 | 4/2013 |
| JP | 2014529907 | 11/2014 |
| KR | 1020050087264 | 8/2005 |
| WO | 02073623 | 9/2002 |
| WO | 2011066234 | 6/2011 |
| WO | 2013032585 | 3/2013 |

OTHER PUBLICATIONS

Taiwanese Office Action Jul. 28, 2015 corresponding to the related Taiwanese Patent Application No. 103110688.
Japanese Office Action dated Feb. 8, 2016 corresponding o the related Japanese Patent Application No. 2015-558239.

* cited by examiner

NON-VOLATILE MEMORY PROGRAM ALGORITHM DEVICE AND METHOD

RELATED APPLICATIONS

This application claims the benefit of U.S. Provisional Application No. 61/785,485, filed Mar. 14, 2013, and which is incorporated herein by reference.

FIELD OF THE INVENTION

The present invention relates to programming of non-volatile memory cells. Typically a non-volatile memory cell includes a floating gate disposed over and insulated from a substrate. During programming, the selected memory cell is programmed through efficient hot-electron injection, where electrons traveling along the substrate are injected onto the floating gate giving the floating gate a negative charge. This is considered a programmed state. During erasing, the selected cell is erased by causing the electrons to tunnel off the floating gate via the Fowler-Nordheim mechanism. This is considered the erased state. During read, conditions are created such that current will flow along the substrate surface underneath the floating gate. If the floating gate is programmed with electrons, it will reduce or prevent such current flow, which is sensed as a programmed state. If the floating gate is not programmed with electrons, it will allow such current flow, which is sensed as an erased state.

In non-volatile memory (NVM) cell operation, fixed program conditions for all cells under all ambient conditions is used because they offer design simplicity. However, such program conditions include a built in wide margin of operation to accommodate cell-to-cell variations, process variations, temperature variations, power supply range, changes of cell characteristics during the memory device's lifetime, etc. As a result, most memory cells under most operating conditions are overstressed during the program operation. Such overstressing shortens device lifetime in terms of endurance and data retention.

There is a need for a programming technique that reliably programs the memory cells without over-programming and thus unnecessary memory cell stress, and that takes into account cell-to-cell variations and other programming variations.

BRIEF SUMMARY OF THE INVENTION

A method of programming a memory device having memory cells each including source and drain regions in a semiconductor substrate with a channel region therebetween, a floating gate disposed over and affecting a conductivity of at least a portion of the channel region, and one or more additional conductive gates insulated from the floating gate and the substrate, wherein each memory cell is programmable by applying programming voltages to the source region and the one or more additional conductive gates to cause electrons originating from the drain region to be injected onto the floating gate, and wherein a program state of each memory cell is readable by applying a voltage differential between the source and the drain regions and measuring a read current in the channel region. The method includes:

1) applying a pulse of programming voltages to the source regions and the one or more conductive gates for a plurality of the memory cells, 2) reading program states of the plurality of memory cells, and 3) repeating steps 1 and 2 until at least one of the plurality of memory cells exhibits a read current in step 2 which reaches a first threshold value, wherein the repeating of steps 1 and 2 includes increasing at least one of the programming voltages of step 1 by a first step value each time step 1 is repeated;

after the first threshold value has been reached, for each of a first subset of the plurality of memory cells:

4) applying a pulse of programming voltages to the source region and the one or more conductive gates of the memory cell, 5) reading a program state of the memory cell, and 6) repeating steps 4 and 5 until the memory cell exhibits a read current in step 5 which reaches a second threshold value different from the first threshold value, wherein the repeating of steps 4 and 5 includes increasing at least one of the programming voltages of step 4 by a second step value each time step 4 is repeated, wherein the second step value is less than the first step value; and after the first threshold value has been reached, for each of a second subset of the plurality of memory cells:

7) applying a pulse of programming voltages to the source region and the one or more conductive gates of the memory cell, 8) reading a program state of the memory cell, and 9) repeating steps 7 and 8 until the memory cell exhibits a read current in step 8 which reaches a third threshold value different from the first and second threshold values, wherein the repeating of steps 7 and 8 includes increasing at least one of the programming voltages of step 7 by a third step value each time step 7 is repeated, wherein the third step value is less than the first step value.

A method of programming a memory device having memory cells each including source and drain regions in a semiconductor substrate with a channel region therebetween, a floating gate disposed over and affecting a conductivity of at least a portion of the channel region, and one or more additional conductive gates insulated from the floating gate and the substrate, wherein each memory cell is programmable by applying programming voltages to the source region and the one or more additional conductive gates to cause electrons originating from the drain region to be injected onto the floating gate, and wherein a program state of each memory cell is readable by applying a voltage differential between the source and the drain regions and measuring a read current in the channel region. The method includes:

for each of a first subset of a plurality of the memory cells:

1) applying a pulse of programming voltages to the source region and the one or more conductive gates of the memory cell, 2) reading a program state of the memory cell, and 3) repeating steps 1 and 2 until the memory cell exhibits a read current in step 2 which reaches a first threshold value, wherein the repeating of steps 1 and 2 includes increasing at least one of the programming voltages of step 1 by a first step value each time step 1 is repeated; and for each of a second subset of the plurality of memory cells:
- 4) applying a pulse of programming voltages to the source region and the one or more conductive gates of the memory cell,
- 5) reading a program state of the memory cell, and
- 6) repeating steps 4 and 5 until the memory cell exhibits a read current in step 5 which reaches a second threshold value different from the first threshold value, wherein the repeating of steps 4 and 5 includes increasing at least one of the programming voltages of step 4 by a second step value each time step 4 is repeated.

A method of programming a memory device having memory cells each including source and drain regions in a semiconductor substrate with a channel region therebetween, a floating gate disposed over and affecting a conductivity of at least a portion of the channel region, and one or more additional conductive gates insulated from the floating gate and the substrate, wherein each memory cell is programmable by applying programming voltages to the source region and the one or more additional conductive gates to cause electrons originating from the drain region to be injected onto the floating gate, and wherein a program state of each memory cell is readable by applying a voltage differential between the source and the drain regions and measuring a read current in the channel region. The method includes:

for each of a plurality of the memory cells:
- 1) applying a pulse of programming voltages to the source region and the one or more conductive gates of the memory cell,
- 2) reading a program state of the memory cell, and
- 3) repeating steps 1 and 2 until the memory cell exhibits a read current in step 2 which reaches a first threshold value, wherein the repeating of steps 1 and 2 includes increasing at least one of the programming voltages of step 1 by a first step value each time step 1 is repeated; and after the first threshold value is reached for all the plurality of memory cells, applying a kicker pulse of programming voltages to the source regions and the one or more conductive gates for all the plurality of the memory cells, wherein the applying of the kicker pulse includes increasing at least one of the programming voltages by a second step value relative to the programming voltages applied in steps 1-3.

A memory device has memory cells (each including source and drain regions in a semiconductor substrate with a channel region therebetween, a floating gate disposed over and affecting a conductivity of at least a portion of the channel region, one or more additional conductive gates insulated from the floating gate and the substrate, wherein each memory cell is configured to be programmable by applying programming voltages to the source region and the one or more additional conductive gates to cause electrons originating from the drain region to be injected onto the floating gate, and wherein a program state of each memory cell is readable by applying a voltage differential between the source and the drain regions and measuring a read current in the channel region) and control circuitry configured to:
- 1) apply a pulse of programming voltages to the source regions and the one or more conductive gates for a plurality of the memory cells,
- 2) read program states of the plurality of memory cells, and
- 3) repeat steps 1 and 2 until at least one of the plurality of memory cells exhibits a read current in step 2 which reaches a first threshold value, wherein the repeat of steps 1 and 2 includes increasing at least one of the programming voltages of step 1 by a first step value each time step 1 is repeated;

after the first threshold value has been reached, for each of a first subset of the plurality of memory cells:
- 4) apply a pulse of programming voltages to the source region and the one or more conductive gates of the memory cell,
- 5) read a program state of the memory cell, and
- 6) repeat steps 4 and 5 until the memory cell exhibits a read current in step 5 which reaches a second threshold value different from the first threshold value, wherein the repeat of steps 4 and 5 includes increasing at least one of the programming voltages of step 4 by a second step value each time step 4 is repeated, wherein the second step value is less than the first step value; and after the first threshold value has been reached, for each of a second subset of the plurality of memory cells:
- 7) apply a pulse of programming voltages to the source region and the one or more conductive gates of the memory cell,
- 8) read a program state of the memory cell, and
- 9) repeat steps 7 and 8 until the memory cell exhibits a read current in step 8 which reaches a third threshold value different from the first and second threshold values, wherein the repeat of steps 7 and 8 includes increasing at least one of the programming voltages of step 7 by a third step value each time step 7 is repeated, wherein the third step value is less than the first step value.

A memory device has memory cells (each including source and drain regions in a semiconductor substrate with a channel region therebetween, a floating gate disposed over and affecting a conductivity of at least a portion of the channel region, one or more additional conductive gates insulated from the floating gate and the substrate, wherein each memory cell is configured to be programmable by applying programming voltages to the source region and the one or more additional conductive gates to cause electrons originating from the drain region to be injected onto the floating gate, and wherein a program state of each memory cell is readable by applying a voltage differential between the source and the drain regions and measuring a read current in the channel region) and control circuitry configured to:

for each of a first subset of a plurality of the memory cells:
- 1) apply a pulse of programming voltages to the source region and the one or more conductive gates of the memory cell,
- 2) read a program state of the memory cell, and
- 3) repeat steps 1 and 2 until the memory cell exhibits a read current in step 2 which reaches a first threshold value, wherein the repeat of steps 1 and 2 includes increasing at least one of the programming voltages of step 1 by a first step value each time step 1 is repeated; and for each of a second subset of the plurality of memory cells:
- 4) apply a pulse of programming voltages to the source region and the one or more conductive gates of the memory cell,
- 5) read a program state of the memory cell, and 6) repeat steps 4 and 5 until the memory cell exhibits a read current in step 5 which reaches a second threshold value different from the first threshold value, wherein the repeat of steps 4 and 5 includes increasing at least one of the programming voltages of step 4 by a second step value each time step 4 is repeated.

A memory device has memory cells (each including source and drain regions in a semiconductor substrate with a channel region therebetween, a floating gate disposed over and affecting a conductivity of at least a portion of the channel region, one or more additional conductive gates insulated from the floating gate and the substrate, wherein each memory cell is configured to be programmable by applying programming voltages to the source region and the one or more additional conductive gates to cause electrons originating from the drain region to be injected onto the floating gate, and wherein a program state of each memory cell is readable by applying a voltage differential between the source and the drain regions and measuring a read current in the channel region) and control circuitry configured to:

for each of a plurality of the memory cells:
1) apply a pulse of programming voltages to the source region and the one or more conductive gates of the memory cell,
2) read a program state of the memory cell, and
3) repeat steps 1 and 2 until the memory cell exhibits a read current in step 2 which reaches a first threshold value, wherein the repeat of steps 1 and 2 includes increasing at least one of the programming voltages of step 1 by a first step value each time step 1 is repeated; and after the first threshold value is reached for all the plurality of memory cells, apply a kicker pulse of programming voltages to the source regions and the one or more conductive gates for all the plurality of the memory cells, wherein the applying of the kicker pulse includes increasing at least one of the programming voltages by a second step value relative to the programming voltages applied in steps 1-3.

Other objects and features of the present invention will become apparent by a review of the specification, claims and appended figures.

DETAILED DESCRIPTION OF THE INVENTION

The present invention reduces or solves the program overstress on memory cells by providing a program algorithm which minimizes cell degradation and at the same time ensures sufficient write margin to accommodate ambient changes and cell behavior changes throughout the device lifetime. This technique results in improved endurance and data retention. The program algorithm can be used for the design and operation of multi-level cell (MLC) non-volatile memory devices, as well as single-level cell (SLC) non-volatile memory devices. The program algorithm can be used for reliability improvement in embedded non-volatile memory devices (i.e. those devices with non-volatile memory cells on the same chip as logic devices), as well as stand-alone non-volatile memory devices. Finally, the program algorithm can be applied to memory cells configurations of varying numbers of conductive gates.

Figure 1:
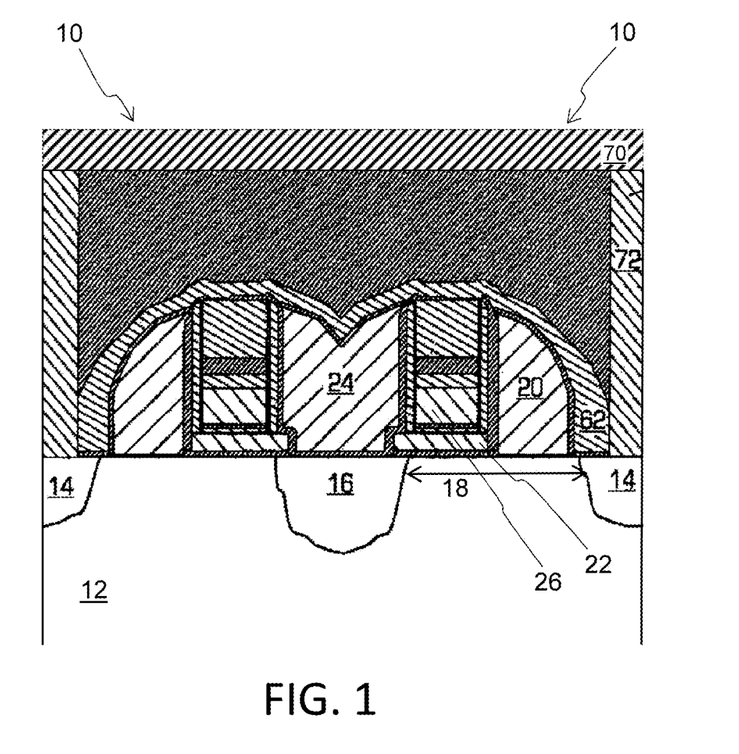
FIG. 1 is a cross-sectional view of a pair of memory cells.

For example, the program algorithm is especially applicable to a split gate non-volatile memory cell of the type disclosed in U.S. Pat. No. 7,927,994, which is incorporated herein by reference for all purposes. FIG. 1 illustrates a pair of such memory cells 10 formed on a semiconductor substrate 12. Source and drain diffusion regions 16/14 are formed in the substrate 12, defining a channel region 18 therebetween. Each of the memory cells has four conductive gates: a select gate 20 disposed over and insulated from a first portion of the channel region 18, a floating gate 22 disposed over and insulated from a second portion of the channel region 18 and a portion of the source region 16, an erase gate 24 disposed over and insulated from the source region 16, and a control gate 26 disposed over and insulated from the floating gate 22. Preferably, the erase gate 24 can have an upper portion that is disposed vertically over the floating gate 22 (e.g. a vertical overhang).

Figure 2:
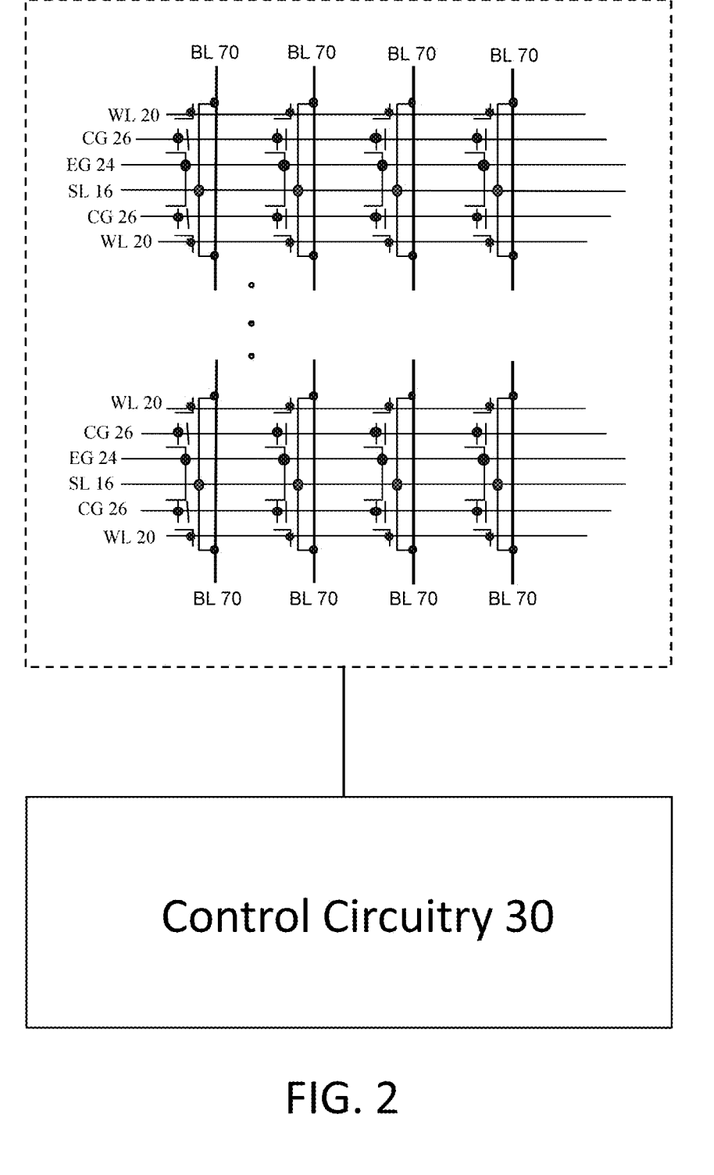
FIG. 2 is a schematic drawing of an array of the memory cells in shown in FIG. 1.

The memory cells are arranged in an array, with columns of such memory cells separated by columns of isolation regions in an interlaced fashion. Each column of memory cells contains pairs of the memory cells in FIG. 1 arranged end to end, whereby each pair of memory cells share the same source region 16, and adjacent pairs of memory cells share the same drain region 14. As illustrated in FIG. 2, the select gates 20 for an entire row of the memory cells connected together as a single conductive line (commonly referred to as a word line (WL)), such that each word line is connected to or forms the select gate 20 for one of the memory cells in each column of the memory cells (i.e. each word line electrically connects together a row of the select gates 20). The control gates 26 are similarly connected together or formed as a continuous control gate line extending along the rows of memory cells (i.e. each electrically connecting together a row of the control gates 26). The erase gates 24 are also similarly connected together or formed as a continuous erase gate line extending along the rows of memory cells (i.e. each electrically connecting together a row of the erase gates 24). The source regions 16 are continuously formed as a source line (SL) that extends in the row direction and serves at the source regions 16 for the entire row of memory cell pairs (i.e. each electrically connecting together a row of the source regions 16). Conductive bit line contacts 72 electrically connect the drains 14 to bit lines 70, whereby each bit line contact 70 electrically connects together a column of the drain regions 14. A predetermined number of rows and columns of memory cells are associated together as a page.

During conventional programming, the selected cell is programmed through efficient hot-electron injection with the portion of the channel under the floating gate in inversion. For the selected memory cell, a medium voltage (e.g. 3-6 volts) is applied to the source region 16 to generate the hot electrons. A small current (e.g. 0.1-5 µA) is applied to the drain 14. A small voltage (e.g. 1-2 volts) is also applied to the select gate. The control gate 26 is biased to a high voltage (e.g. 6-9 volts) to utilize the high coupling ratio and to maximize the voltage coupling to the floating gate 22. The erase gate 24 is also biased to a medium or high voltage (e.g. 3-9 volts) to maximize voltage coupling to the floating gate 22. The high voltage coupled to the floating gate induces a channel inversion under the floating gate and concentrates lateral field in the split area (between the select gate 20 and floating gate 22) to generate hot electrons more effectively. In addition, the voltages provide a high vertical field to attract hot electrons onto the floating gate and reduce injection energy barrier. During programming, electrons generated by the drain region 14 will flow from the drain region 14 towards the source region 16 through the weakly-inverted portion of the channel region under the select gate 20. As the electrons reach the portion of the channel region 18 under the floating gate 22, they will see the high lateral field. The electrons will accelerate and become heated, with a significant portion of hot electrons being injected through the insulating layer and onto the floating gate 22. The injection of electrons onto the floating gate 22 will continue until the reduction of the charge on the floating gate 22 can no longer sustain a high potential surface inversion layer along the channel region to generate hot electrons. At that point, the electrons or the negative charges in the floating gate 22 will decrease the electron flow from the drain region 14 onto the floating gate 22.

Conventional programming therefore applies the above mentioned voltages for a predetermined time period, where the voltages and time period are set high enough (i.e. include additional margins) to ensure proper programming of the floating gate for all memory cells being programmed. However, by using fixed voltage and time margins to ensure the memory cells are all programmed, often times memory cells are over stressed during programming (i.e. some memory cells over-programmed to ensure other memory cells are properly programmed). Therefore, the programming method of the present invention uses pulses of program voltages where at least one of the voltages is stepped up in value for each subsequent pulse based upon the results of intervening read verifications, and the voltage step size is adjusted as the memory cells reach the desired charge states. The method also individually ceases cell programming at a point where the floating gate has been reliably programmed without over-programming that would unduly stress the memory cell.

Figure 3:
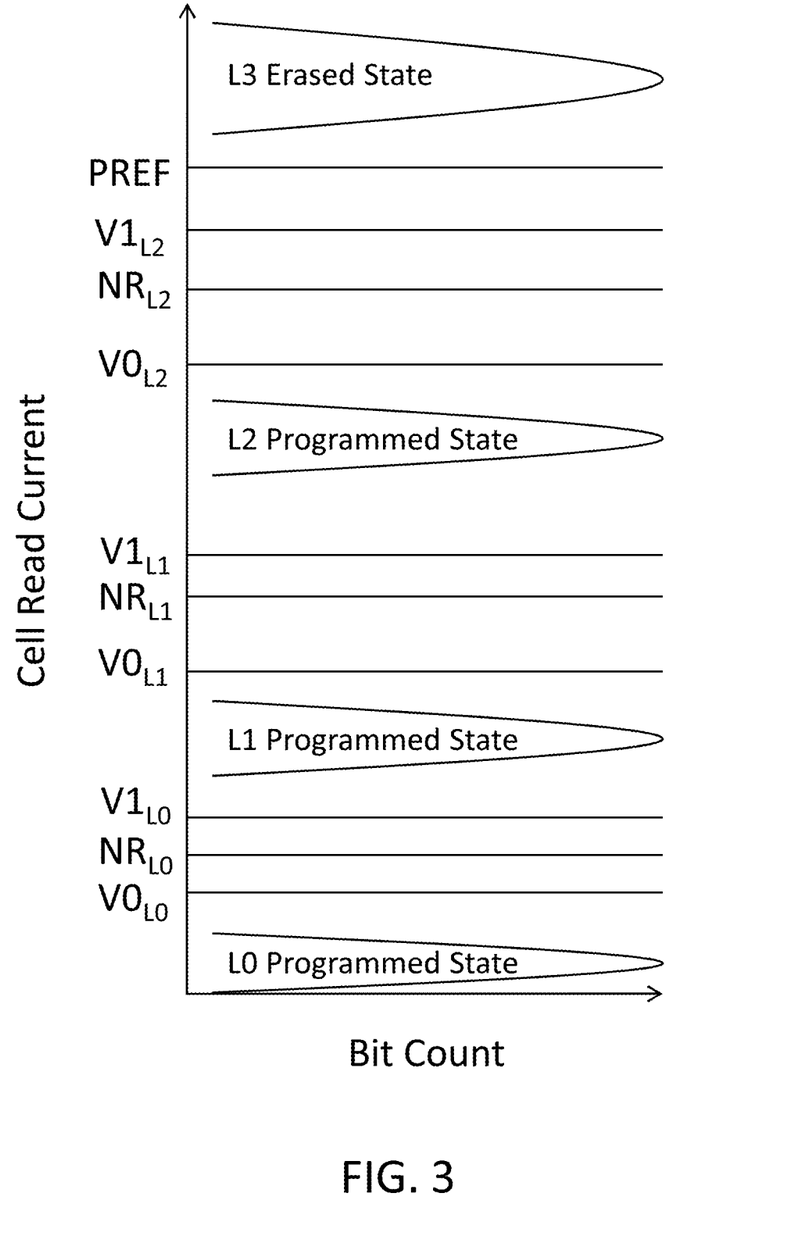
FIG. 3 is a graph illustrating the program and erase states of a MLC memory cell as a function of read current.

The programming method of the present invention can be used in single level cells (SLC's) having 1 programmed state, as well as multi-level cells (MLC's) having 2 or more programmed states. FIG. 3 illustrates the charge states as a function of detected read current, for multi-level cells (MLC's) having 3 programmed states. In this example, the floating gate can be programmed with varying levels of electrons which correspond to different programmed states, each having a unique range of detectable read currents. Level L3 represents the erased state (floating gate is positively charged, thus allowing a strong detected read current when the read voltages are applied). Levels L2 and L1 represent gently programmed states (floating gate is programmed with moderate number of electrons to reduce read current when the read voltages are applied). Level L0 represents strongly programmed state (floating gate is programmed with sufficient electrons to reduce read current to minimal levels when the read voltages are applied). The 3 programmed states (L2, L1 and L0), together with the erased state (L3), are used to store 2 bits of data in each cell, thereby doubling storage density without increasing memory array area on chip.

During read, the cell read current is compared with three separate normal read reference levels ($NR_{L0}$, $NR_{L1}$, and $NR_{L2}$) to determine the cell's charge state. Cells with read current less than $NR_{L0}$ are determined to be in L0 state. Cells with read current higher than $NR_{L0}$ but lower than $NR_{L1}$ are determined to be in L1 state. Cells with read current higher than $NR_{L1}$ but lower than $NR_{L2}$ are determined to be in L2 state. Cells with read current higher than $NR_{L2}$ are determined to be in L3 state.

During the programming algorithm, cells are verified against separate verification reference levels, which provide margin guard-band from NR levels, and ensure subsequent read against NR reference levels will detect the cell charge states reliably. $V0_{L0}$, $V0_{L1}$, and $V0_{L2}$ are verification read reference levels which provide lower margins to the respective NR levels. These margins take into account trapped charge relaxation, read disturb, read noise, temperature/voltage sensitivity, and parasitic resistance effect. $V1_{L0}$, $V1_{L1}$, and $V1_{L2}$ are verification read reference levels which provide higher margins to the respective NR levels. These margins take into account read noise, temperature/voltage sensitivity, program disturb, parasitic resistance effect, and charge coupling from neighboring cells. The program algorithm ensures that for L2 and L1 states, each cell is programmed to be below the corresponding V0 level, but still above the underlying V1 level. For L0, each cell is programmed sufficiently below $V0_{L0}$ to ensure reliable subsequent read, but not exceedingly so.

There is a separate verification reference level PREF, located slightly above $V1_{L2}$. PREF serves as a trigger for adjusting the voltage step size used in the program pulse train. This adjustment helps to maximize program throughput without sacrificing accuracy.

The details of the program algorithm are described next. The program algorithm involves programming a group of cells with a series of program pulses, each having an incrementally greater strength compared to the preceding pulse. An example of the first programming pulse condition is applying the following voltages/current: source line=3V, control gate=4V, erase gate 3V, select gate=1-2V, and bit line=1 µA, for a predetermined amount of time (e.g. ~1 µs). The increment of strength can be achieved by incrementing one of the voltage biases up by a certain step size for each successive pulse (e.g. control gate voltage VCG, source line voltage VSL, or erase gate voltage VEG). In the example below, both VCG and VSL are incremented. However, any combination of program voltage increments for VCG, VSL and/or VEG could be employed.

Preferably, a plurality of memory cells are programmed in the same program operation. For example, a page of data can be programmed to a plurality of memory cells sharing the same word line WL, in the same operation. Alternatively, a page of data can also be separated into several groups, with each group of cells being programmed in parallel, and additional groups to be programmed after each group completes programming. To select those memory cells on the selected WL which are to be programmed into one of the programmed states ("selected cells"), those BLs are biased to program condition, e.g. 1 uA. To un-select those memory cells on the selected WL which are to stay in the erased state ("un-selected cells"), the un-selected BLs are biased to a condition which inhibits programming, such as 2V.

Figure 4:
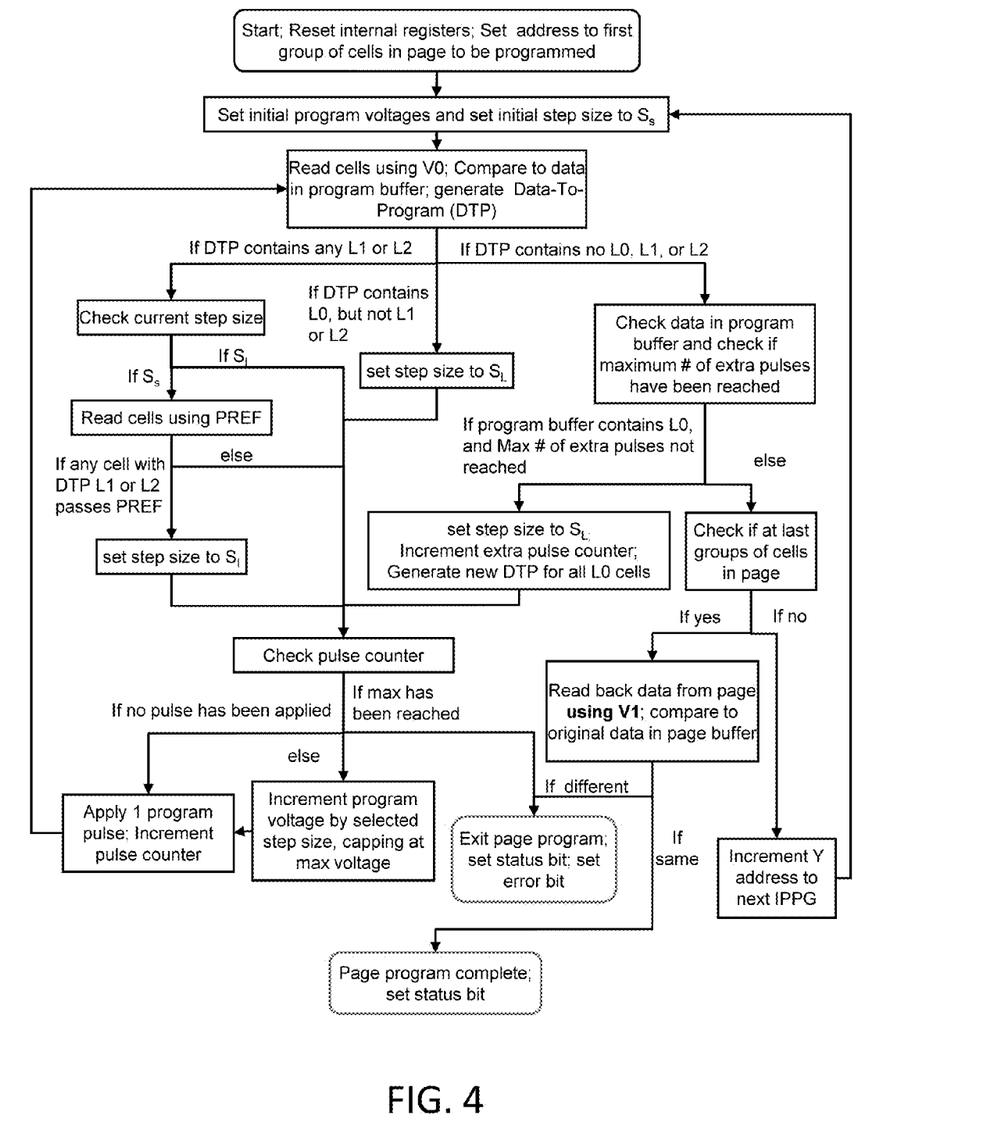
FIG. 4 is a flow diagram showing the sequence of steps in the iterative programming method for MLC memory cells.

The programming steps are illustrated in FIG. 4. Programming begins by setting up the initial program conditions and clearing internal registers which track the program process. The group of cells to be programmed is then read back using the three lower margin reference levels $V0_{L0}$, $V0_{L1}$, and $V0_{L2}$. Data from this read is compared to the data in the program buffer (the external data that needs to be programmed into this group of cells at the end of the algorithm), and data-to-be-programmed (DTP) is generated from the comparison and stored in a second buffer. Only the cells with DTP of L0, L1, or L2 are selected for subsequent programming. If a cell is verified to be in a lower-current charge state than its respective level in the program buffer, an error signal is set to notify the system that a program error has occurred.

If the initial DTP contains any L1 or L2 data (independent of any presence of L0 data), then the group of cells to be programmed are then verified against PREF to determine the initial voltage step size. If any cell with DTP of L1 or L2 has reached PREF (i.e. has read cell current equal to or less than PREF), this indicates these cells are in a charge state close to their final destination, and the programming needs to be gentle in order to precisely program them into the destination levels. This is achieved by setting the initial VCG and VSL step sizes to small values $S_S$, e.g. 50 mV. If none of the cells destined for L1 or L2 data has reached PREF (i.e. they all have read cell currents greater than PREF), then VCG and VSL step sizes are initially set to intermediate values $S_I$, e.g. 200 mV, to speed up this initial stage of programming. If the initial DTP contains L0 data but not L1 or L2 data, then there is no need to precisely program data into the intermediate levels, and program voltage steps are initially set to larger values $S_L$, e.g. 500 mV.

Program pulses are then applied, with each successive pulse having the VCG and VSL voltages stepped up in value by the initially set step size $S_S$, $S_I$ or $S_L$. After each pulse, each of the cells being programmed are subjected again to a verification read using the three lower margin reference levels $V0_{L0}$, $V0_{L1}$, and $V0_{L2}$. A new DTP is generated from the result of this verification read, and the process is continued as described above. In the case where the initial step size was set to $S_I$, the programming pulses continue until one of the cells with DTP of L1 or L2 reaches PREF, at which time the step size is dropped from $S_I$ to $S_S$. If at any time a cell with DTP of L1 reaches $V0_{L1}$, it is removed from DTP and programming for that cell ceases. Likewise, if at any time a cell with DTP of L2 reaches $V0_{L2}$, it is removed from DTP and programming for that cell ceases. The removal of L1 and L2 cells from DTP is preferably irreversible. After a cell reaches its respective V0 and is removed from DTP, even if a subsequent verification indicates it to be above V0 (this is common due to read noise), this cell remains removed from DTP. This measure is taken to ensure L1 and L2 cells are always programmed precisely with a steady training of pulses which have well-controlled step size. If several pulses are skipped after a cell passes verification, and a subsequent pulse is applied when the cell fails verification again, the sudden jump in program voltage will cause over-program.

Finally, if at any time a cell with DTP of L0 reaches $V0_{L0}$, it is removed from DTP and programming for that cell ceases. In the case where the initial step size was set to $S_S$, the programming pulses continue until all of the cells with DTP of L1 and L2 reach their V0 thresholds and are dropped from DTP (i.e. these cells have reached their final destination). At that time, if there are any cells with DTP of L0, the step size is changed from $S_S$ to $S_L$, as there is no longer a need for gentle programming. Likewise, if while programming using step size $S_I$ all cells with DTP of L1 and L2 reach their final destinations and are dropped from DTP, and there are still cells with DTP of L0, then the step size is changed from $S_I$ to $S_L$. Finally, if the initial step size was set at $S_L$, then programming will continue using that step size until all the cells with DTP of L0 reach $V0_{L0}$. As cells reach their destinations and are dropped from DTP and programming, the programming process continues for the remaining cells until either DTP no longer contains any L0, L1, or L2 data, or until a maximum predetermined number of program pulses is reached. In the latter case, an error signal is set to report program failure to the system.

For L0 cells, it is sometimes advantageous to place their final destination in a deeper programmed state than can be sensed by read current. For example, use of an existing low voltage power supply for read biases has significant advantages in read speed and power consumption. However this limit on read voltage also limits voltage coupling to the floating gate, and in turn reduces the cell read current. It can be difficult to sense the program margin on the deeply programmed state beyond the $V0_{L0}$ level. The $NR_{L0}$-$V0_{L0}$ guard-band margin unnecessarily occupies a portion of the overall operating window, and the deeply programmed charge states are not utilized. Therefore, one or more extra program pulses with carefully designed voltage stepping can be applied to provide extra reliability guard-band, and enable the expansion of the cell operating window into a more deeply programmed state. After DTP only contains L3 data, the program buffer is checked for any L0 data. If yes, this indicates there were cells programmed to L0, and they have passed $L0_{V0}$ verification. The voltage step size is set to large values, e.g. 500 mV, and a pre-determined number of extra program pulses are applied (i.e. the first pulse starting 500 mV over the last pulse used to program the last L0 cell to reach $V0_{L0}$), each with voltage bias incremented by the selected step size (i.e. $S_L$). The selection of step size and number of extra pulses depends on the margin requirement.

After one group of cells completes programming, additional groups of cells inside the same page are programmed in the same manner. After the entire page completes programming, it is subjected to a verification read using reference levels $V1_{L0}$, $V1_{L1}$, and $V1_{L2}$, and the resulting data is compared to the original data in the program buffer. This final verification checks for possible over-programming and program disturb during the page program process. Errors are reported if any verification returns unexpected data, alerting the system of program failure.

To ensure reliability, maximum program voltage values are placed on the program voltages which are being stepped up in value. To illustrate, for the non-limiting example described above, a maximum voltage for the source of 4-8 V, such as 5V, is imposed. Likewise, a maximum voltage for the control gate of 8-11 V, such as 10V, is imposed. If a maximum voltage has been reached, program will continue, without further incrementing this particular voltage. A maximum number of program pulses of 1-256, such as 64 is also imposed. If the maximum pulse number is reached, program stops, and an error signal is set to indicate program error.

Figure 5:
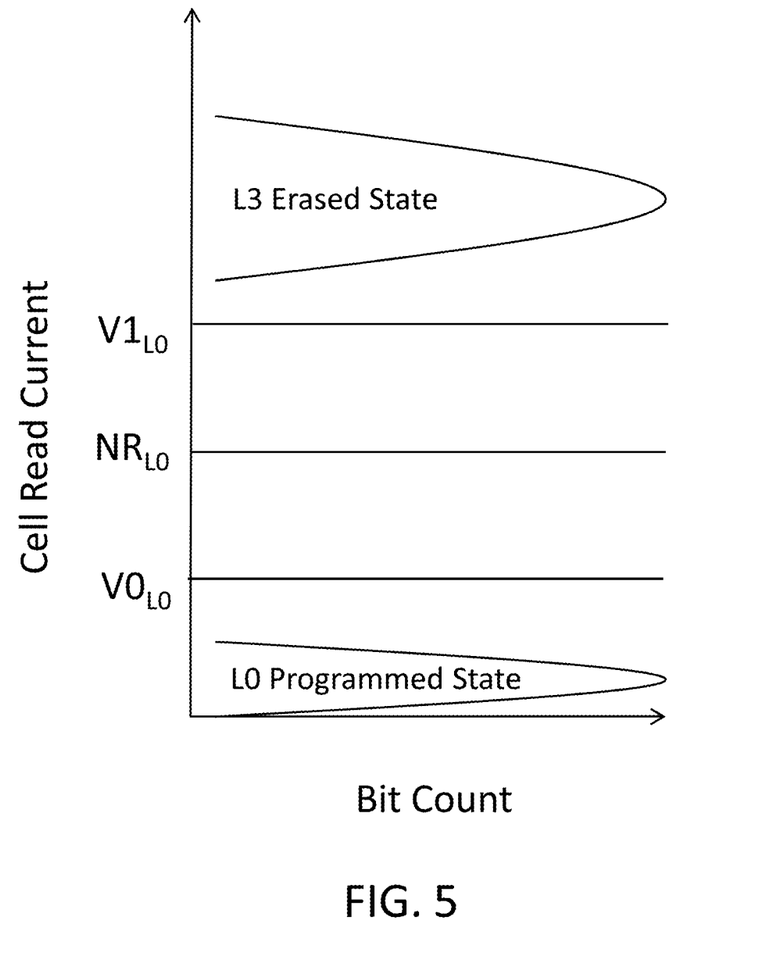
FIG. 5 is a graph illustrating the program and erase states of an SLC memory cell as a function of read current.
Figure 6:
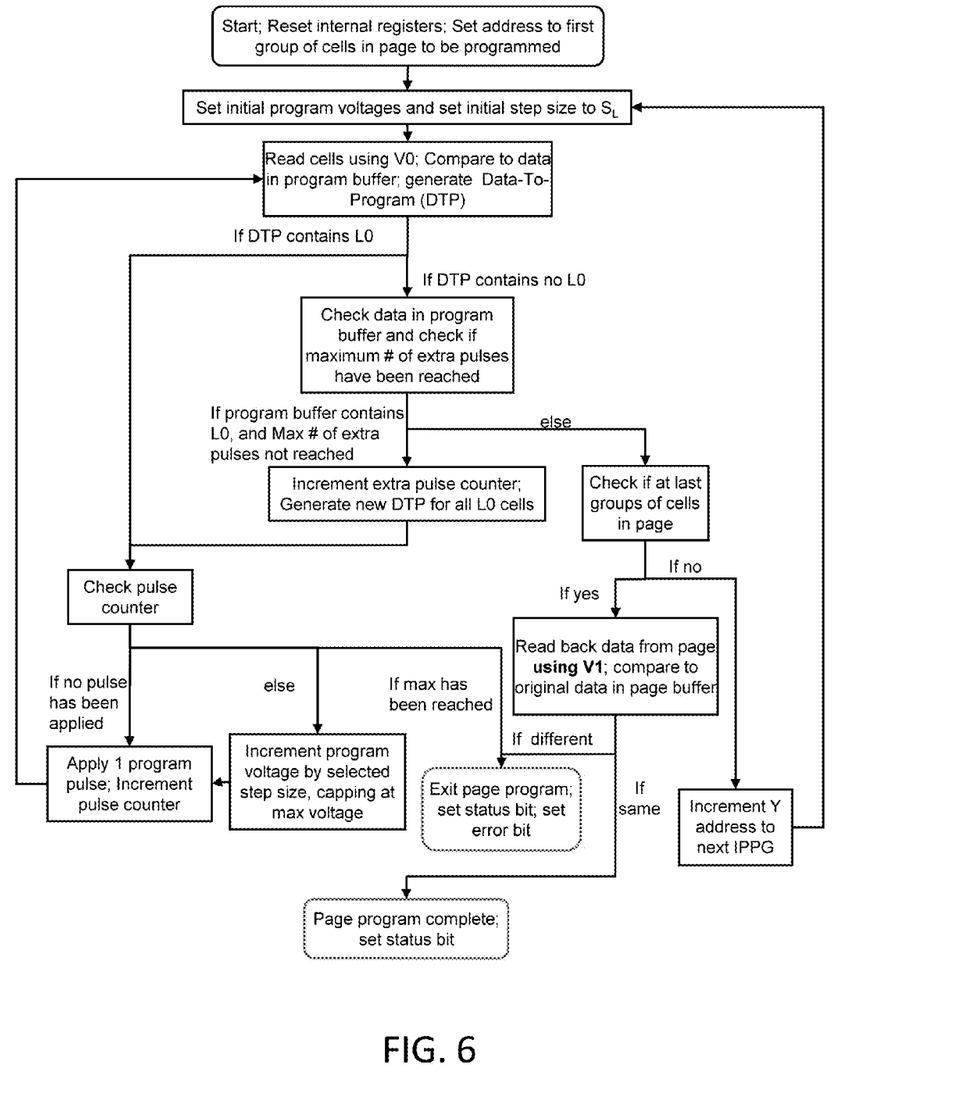
FIG. 6 is a flow diagram showing the sequence of steps in the iterative programming method for SLC memory cells.

The program algorithm described above is equally applicable to SLC. For SLC cells, there are no L1 or L2 cells. FIG. 5 shows the program and erase states for an SLC memory cell as a function of read current. The algorithm is simplified to that shown in FIG. 6. Here the scenario for DTP containing L1 or L2 data is not present. The initial program pulse can be set to a stronger condition, and program voltage step size is directly set to the high value $S_L$ (e.g. 500 mV) to quickly program cells below $V0_{L0}$. After that, extra program pulses are applied in the same way as in MLC, to provide extra margin for read reliability.

The programming technique describe above has many advantages. Program disturb immunity is improved by minimizing high voltage stress. Endurance lifetime is improved by minimizing program stress and minimizing charge transfer during each program/erase cycle. Data retention lifetime is improved by minimizing program stress, and by building a sufficient guard-band to accommodate for post-cycling trapped-charge relaxation. Program efficiency is maximized by optimizing voltage step sizes and reference levels in the three different stages of programming.

As noted above, the step increase in voltage can be for one or more of the program voltages. For the memory cell of FIG. 1, the non-limiting example described above stepped up the voltages for the source and control gate, but any or all of the program voltages for source, control gate and erase gate can be stepped up in value during the iterative program-read operation. While the steps $S_s$, $S_1$ and $S_L$ in the non-limiting example was the same for both the source and control gate, it need not be. The source could be stepped up in value by a different amount than for the control gate.

Control circuitry for controlling and performing program operations on memory arrays is well known. Control circuitry 30 illustrated in FIG. 2 is such circuitry. However, control circuitry is further configured to control and perform the programming algorithms described above on the memory array, and is preferably included on the same chip as the array of memory cells.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Single layers of material could be formed as multiple layers of such or similar materials, and vice versa. While the MLC example above includes three program states and an erase state, the programming technique described above is equally applicable to any MLC's with two or more program states. Lastly, while the iterative programming technique is described in the context of a memory cell having four conductive gates, it is equally applicable to other non-volatile memory cell configurations having greater or fewer conductive gates.

What is claimed is:

1. A method of programming a memory device having memory cells each including source and drain regions in a semiconductor substrate with a channel region therebetween, a floating gate disposed over and affecting a conductivity of at least a portion of the channel region, and one or more additional conductive gates insulated from the floating gate and the substrate, wherein each memory cell is programmable by applying programming voltages to the source region and the one or more additional conductive gates to cause electrons originating from the drain region to be injected onto the floating gate, and wherein a program state of each memory cell is readable by applying a voltage differential between the source and the drain regions and measuring a read current in the channel region, the method comprising:
   1) applying a pulse of programming voltages to the source regions and the one or more conductive gates for a plurality of the memory cells,
   2) reading program states of the plurality of memory cells, and
   3) repeating steps 1 and 2 until at least one of the plurality of memory cells exhibits a read current in step 2 which reaches a first threshold value, wherein the repeating of steps 1 and 2 includes increasing at least one of the programming voltages of step 1 by a first step value each time step 1 is repeated;

after the first threshold value has been reached, for each of a first subset of the plurality of memory cells:
   4) applying a pulse of programming voltages to the source region and the one or more conductive gates of the memory cell,
   5) reading a program state of the memory cell, and
   6) repeating steps 4 and 5 until the memory cell exhibits a read current in step 5 which reaches a second threshold value different from the first threshold value, wherein the repeating of steps 4 and 5 includes increasing at least one of the programming voltages of step 4 by a second step value each time step 4 is repeated, wherein the second step value is less than the first step value; and after the first threshold value has been reached, for each of a second subset of the plurality of memory cells:
   7) applying a pulse of programming voltages to the source region and the one or more conductive gates of the memory cell,
   8) reading a program state of the memory cell, and
   9) repeating steps 7 and 8 until the memory cell exhibits a read current in step 8 which reaches a third threshold value different from the first and second threshold values, wherein the repeating of steps 7 and 8 includes increasing at least one of the programming voltages of step 7 by a third step value each time step 7 is repeated, wherein the third step value is less than the first step value.

2. The method of claim 1, wherein the second and third step values are equal to each other.

3. The method of claim 1, wherein the first and third step values are greater than the second step value.

4. The method of claim 1, wherein the first threshold value is greater than the second threshold value, and the second threshold value is greater than the third threshold value.

5. The method of claim 1, wherein the one or more additional conductive gates for each memory cell includes a control gate disposed over and affecting the conductivity of a second portion of the channel region.

6. The method of claim 1, wherein after the second threshold value has been reached for the first subset of the plurality of memory cells, and after the third threshold value has been reached for the second subset of the plurality of memory cells, for each of a third subset of the plurality of memory cells the method further comprising:
   10) applying a pulse of programming voltages to the source region and the one or more conductive gates of the memory cell,
   11) reading a program state of the memory cell, and
   12) repeating steps 10 and 11 until the memory cell exhibits a read current in step 11 which reaches a fourth threshold value different from the first and second and third threshold values, wherein the repeating of steps 10 and 11 includes increasing at least one of the programming voltages of step 10 by a fourth step value each time step 10 is repeated, wherein the fourth step value is greater than the second and third step values.

7. The method of claim 6, wherein the fourth step value is equal to the first step value.

8. The method of claim 6, further comprising:
   after the fourth threshold value is reached for all the third subset of the plurality of memory cells, applying a kicker pulse of programming voltages to the source regions and the one or more conductive gates for all of the third subset of the plurality of the memory cells, wherein the applying of the kicker pulse includes increasing at least one of the programming voltages by a fifth step value relative to the programming voltages applied in steps 10-12.

9. The method of claim 8, wherein the fifth step value is greater than the fourth step value.

10. A method of programming a memory device having memory cells each including source and drain regions in a semiconductor substrate with a channel region therebetween, a floating gate disposed over and affecting a conductivity of at least a portion of the channel region, and one or more additional conductive gates insulated from the floating gate and the substrate, wherein each memory cell is programmable by applying programming voltages to the source region and the one or more additional conductive gates to cause electrons originating from the drain region to be injected onto the floating gate, and wherein a program state of each memory cell is readable by applying a voltage differential between the source and the drain regions and measuring a read current in the channel region, the method comprising:

for each of a first subset of a plurality of the memory cells:
1) applying a pulse of programming voltages to the source region and the one or more conductive gates of the memory cell,
2) reading a program state of the memory cell, and
3) repeating steps 1 and 2 until the memory cell exhibits a read current in step 2 which reaches a first threshold value, wherein the repeating of steps 1 and 2 includes increasing at least one of the programming voltages of step 1 by a first step value each time step 1 is repeated; and for each of a second subset of the plurality of memory cells:
4) applying a pulse of programming voltages to the source region and the one or more conductive gates of the memory cell,
5) reading a program state of the memory cell, and
6) repeating steps 4 and 5 until the memory cell exhibits a read current in step 5 which reaches a second threshold value different from the first threshold value, wherein the repeating of steps 4 and 5 includes increasing at least one of the programming voltages of step 4 by a second step value each time step 4 is repeated.

11. The method of claim 10, wherein the first and second step values are equal to each other.

12. The method of claim 10, wherein the second step value is greater than the first step value.

13. The method of claim 10, wherein the first threshold value is greater than the second threshold value.

14. The method of claim 10, wherein the one or more additional conductive gates for each memory cell includes a control gate disposed over and affecting the conductivity of a second portion of the channel region.

15. The method of claim 10, wherein after the first threshold value has been reached for the first subset of the plurality of memory cells, and after the second threshold value has been reached for the second subset of the plurality of memory cells, for each of a third subset of the plurality of memory cells the method further comprising:

7) applying a pulse of programming voltages to the source region and the one or more conductive gates of the memory cell,
8) reading a program state of the memory cell, and
9) repeating steps 7 and 8 until the memory cell exhibits a read current in step 8 which reaches a third threshold value different from the first and second threshold values, wherein the repeating of steps 7 and 8 includes increasing at least one of the programming voltages of step 7 by a third step value each time step 7 is repeated, wherein the third step value is greater than the first and second step values.

16. The method of claim 15, further comprising:
after the third threshold value is reached for all the third subset of the plurality of memory cells, applying a kicker pulse of programming voltages to the source regions and the one or more conductive gates for all of the third subset of the plurality of the memory cells, wherein the applying of the kicker pulse includes increasing at least one of the programming voltages by a fourth step value relative to the programming voltages applied in steps 7-9.

17. The method of claim 16, wherein the fourth step value is greater than the third step value.

18. A method of programming a memory device having memory cells each including source and drain regions in a semiconductor substrate with a channel region therebetween, a floating gate disposed over and affecting a conductivity of at least a portion of the channel region, and one or more additional conductive gates insulated from the floating gate and the substrate, wherein each memory cell is programmable by applying programming voltages to the source region and the one or more additional conductive gates to cause electrons originating from the drain region to be injected onto the floating gate, and wherein a program state of each memory cell is readable by applying a voltage differential between the source and the drain regions and measuring a read current in the channel region, the method comprising:

for each of a plurality of the memory cells:
1) applying a pulse of programming voltages to the source region and the one or more conductive gates of the memory cell,
2) reading a program state of the memory cell, and
3) repeating steps 1 and 2 until the memory cell exhibits a read current in step 2 which reaches a first threshold value, wherein the repeating of steps 1 and 2 includes increasing at least one of the programming voltages of step 1 by a first step value each time step 1 is repeated; and after the first threshold value is reached for all the plurality of memory cells, applying a kicker pulse of programming voltages to the source regions and the one or more conductive gates for all the plurality of the memory cells, wherein the applying of the kicker pulse includes increasing at least one of the programming voltages by a second step value relative to the programming voltages applied in steps 1-3.

19. The method of claim 18, wherein the second step value is greater than the first step value.

20. A memory device, comprising:
memory cells each including:
source and drain regions in a semiconductor substrate with a channel region therebetween,
a floating gate disposed over and affecting a conductivity of at least a portion of the channel region,
one or more additional conductive gates insulated from the floating gate and the substrate,
wherein each memory cell is configured to be programmable by applying programming voltages to the source region and the one or more additional conductive gates to cause electrons originating from the drain region to be injected onto the floating gate, and wherein a program state of each memory cell is readable by applying a voltage differential between the source and the drain regions and measuring a read current in the channel region;

control circuitry configured to:
1) apply a pulse of programming voltages to the source regions and the one or more conductive gates for a plurality of the memory cells,
2) read program states of the plurality of memory cells, and
3) repeat steps 1 and 2 until at least one of the plurality of memory cells exhibits a read current in step 2 which reaches a first threshold value, wherein the repeat of steps 1 and 2 includes increasing at least one of the programming voltages of step 1 by a first step value each time step 1 is repeated;

after the first threshold value has been reached, for each of a first subset of the plurality of memory cells:
4) apply a pulse of programming voltages to the source region and the one or more conductive gates of the memory cell,
5) read a program state of the memory cell, and
6) repeat steps 4 and 5 until the memory cell exhibits a read current in step 5 which reaches a second threshold value different from the first threshold value, wherein the repeat of steps 4 and 5 includes increasing at least one of the programming voltages of step 4 by a second step value each time step 4 is repeated, wherein the second step value is less than the first step value; and after the first threshold value has been reached, for each of a second subset of the plurality of memory cells:
7) apply a pulse of programming voltages to the source region and the one or more conductive gates of the memory cell,
8) read a program state of the memory cell, and
9) repeat steps 7 and 8 until the memory cell exhibits a read current in step 8 which reaches a third threshold value different from the first and second threshold values, wherein the repeat of steps 7 and 8 includes increasing at least one of the programming voltages of step 7 by a third step value each time step 7 is repeated, wherein the third step value is less than the first step value.

21. The memory device of claim 20, wherein the second and third step values are equal to each other.

22. The memory device of claim 20, wherein the first and third step values are greater than the second step value.

23. The memory device of claim 20, wherein the first threshold value is greater than the second threshold value, and the second threshold value is greater than the third threshold value.

24. The memory device of claim 20, wherein the one or more additional conductive gates for each memory cell includes a control gate disposed over and affecting the conductivity of a second portion of the channel region.

25. The memory device of claim 20, wherein after the second threshold value has been reached for the first subset of the plurality of memory cells, and after the third threshold value has been reached for the second subset of the plurality of memory cells, for each of a third subset of the plurality of memory cells the control circuitry is configured to:
10) apply a pulse of programming voltages to the source region and the one or more conductive gates of the memory cell,
11) read a program state of the memory cell, and 12) repeat steps 10 and 11 until the memory cell exhibits a read current in step 11 which reaches a fourth threshold value different from the first and second and third threshold values, wherein the repeat of steps 10 and 11 includes increasing at least one of the programming voltages of step 10 by a fourth step value each time step 10 is repeated, wherein the fourth step value is greater than the second and third step values.

26. The memory device of claim 25, wherein the fourth step value is equal to the first step value.

27. The memory device of claim 25, further comprising:
after the fourth threshold value is reached for all the third subset of the plurality of memory cells, the control circuitry configured to apply a kicker pulse of programming voltages to the source regions and the one or more conductive gates for all of the third subset of the plurality of the memory cells, wherein the applying of the kicker pulse includes increasing at least one of the programming voltages by a fifth step value relative to the programming voltages applied in steps 10-12.

28. The memory device of claim 27, wherein the fifth step value is greater than the fourth step value.

29. A memory device comprising:
memory cells each including:
source and drain regions in a semiconductor substrate with a channel region therebetween,
a floating gate disposed over and affecting a conductivity of at least a portion of the channel region,
one or more additional conductive gates insulated from the floating gate and the substrate,
wherein each memory cell is configured to be programmable by applying programming voltages to the source region and the one or more additional conductive gates to cause electrons originating from the drain region to be injected onto the floating gate, and
wherein a program state of each memory cell is readable by applying a voltage differential between the source and the drain regions and measuring a read current in the channel region;

control circuitry configured to:
for each of a first subset of a plurality of the memory cells:
1) apply a pulse of programming voltages to the source region and the one or more conductive gates of the memory cell,
2) read a program state of the memory cell, and
3) repeat steps 1 and 2 until the memory cell exhibits a read current in step 2 which reaches a first threshold value, wherein the repeat of steps 1 and 2 includes increasing at least one of the programming voltages of step 1 by a first step value each time step 1 is repeated; and
for each of a second subset of the plurality of memory cells:
4) apply a pulse of programming voltages to the source region and the one or more conductive gates of the memory cell,
5) read a program state of the memory cell, and
6) repeat steps 4 and 5 until the memory cell exhibits a read current in step 5 which reaches a second threshold value different from the first threshold value, wherein the repeat of steps 4 and 5 includes increasing at least one of the programming voltages of step 4 by a second step value each time step 4 is repeated.

30. The memory device of claim 29, wherein the first and second step values are equal to each other.

31. The memory device of claim 29, wherein the second step value is greater than the first step value.

32. The memory device of claim 29, wherein the first threshold value is greater than the second threshold value.

33. The memory device of claim 29, wherein the one or more additional conductive gates for each memory cell includes a control gate disposed over and affecting the conductivity of a second portion of the channel region.

34. The memory device of claim 29, wherein after the first threshold value has been reached for the first subset of the plurality of memory cells, and after the second threshold value has been reached for the second subset of the plurality of memory cells, for each of a third subset of the plurality of memory cells the control circuit is configured to:
   7) apply a pulse of programming voltages to the source region and the one or more conductive gates of the memory cell,
   8) read a program state of the memory cell, and
   9) repeat steps 7 and 8 until the memory cell exhibits a read current in step 8 which reaches a third threshold value different from the first and second threshold values, wherein the repeat of steps 7 and 8 includes increasing at least one of the programming voltages of step 7 by a third step value each time step 7 is repeated, wherein the third step value is greater than the first and second step values.

35. The memory device of claim 34, further comprising: after the third threshold value is reached for all the third subset of the plurality of memory cells, the control circuitry configured to apply a kicker pulse of programming voltages to the source regions and the one or more conductive gates for all of the third subset of the plurality of the memory cells, wherein the applying of the kicker pulse includes increasing at least one of the programming voltages by a fourth step value relative to the programming voltages applied in steps 7-9.

36. The memory device of claim 35, wherein the fourth step value is greater than the third step value.

37. A memory device comprising:
memory cells each including:
   source and drain regions in a semiconductor substrate with a channel region therebetween,
   a floating gate disposed over and affecting a conductivity of at least a portion of the channel region,
   one or more additional conductive gates insulated from the floating gate and the substrate,
   wherein each memory cell is configured to be programmable by applying programming voltages to the source region and the one or more additional conductive gates to cause electrons originating from the drain region to be injected onto the floating gate, and wherein a program state of each memory cell is readable by applying a voltage differential between the source and the drain regions and measuring a read current in the channel region;
control circuitry configured to:
   for each of a plurality of the memory cells:
      1) apply a pulse of programming voltages to the source region and the one or more conductive gates of the memory cell,
      2) read a program state of the memory cell, and
      3) repeat steps 1 and 2 until the memory cell exhibits a read current in step 2 which reaches a first threshold value, wherein the repeat of steps 1 and 2 includes increasing at least one of the programming voltages of step 1 by a first step value each time step 1 is repeated; and
   after the first threshold value is reached for all the plurality of memory cells, apply a kicker pulse of programming voltages to the source regions and the one or more conductive gates for all the plurality of the memory cells, wherein the applying of the kicker pulse includes increasing at least one of the programming voltages by a second step value relative to the programming voltages applied in steps 1-3.

38. The memory device of claim 37, wherein the second step value is greater than the first step value.

* * * * *